United States Patent
Xu et al.

(10) Patent No.: US 12,395,129 B2
(45) Date of Patent: Aug. 19, 2025

(54) DIFFERENTIAL-FOLLOWER CONTROL CIRCUIT

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Daiguo Xu, Chongqing (CN); Dongbing Fu, Chongqing (CN); Zhengping Zhang, Chongqing (CN); Zhou Yu, Chongqing (CN); Jian'an Wang, Chongqing (CN); Can Zhu, Chongqing (CN); Ruzhang Li, Chongqing (CN); Guangbing Chen, Chongqing (CN); Yuxin Wang, Chongqing (CN); Xueliang Xu, Chongqing (CN)

(73) Assignees: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 342 days.

(21) Appl. No.: 17/921,991

(22) PCT Filed: Jan. 19, 2021

(86) PCT No.: PCT/CN2021/072718
§ 371 (c)(1),
(2) Date: Oct. 28, 2022

(87) PCT Pub. No.: WO2022/032986
PCT Pub. Date: Feb. 17, 2022

(65) Prior Publication Data
US 2023/0198475 A1 Jun. 22, 2023

(30) Foreign Application Priority Data
Aug. 10, 2020 (CN) .......................... 202010795640.1

(51) Int. Cl.
*H03F 1/32* (2006.01)
*H03F 3/45* (2006.01)

(52) U.S. Cl.
CPC ....... *H03F 1/3211* (2013.01); *H03F 3/45179* (2013.01); *H03F 2203/45006* (2013.01)

(58) Field of Classification Search
CPC ............... H03F 1/3211; H03F 3/45179; H03F 2203/45006; H03F 2203/5003;
(Continued)

(56) References Cited

U.S. PATENT DOCUMENTS 10,141,897 B2   11/2018   Yang et al.
2010/0225379 A1*  9/2010  Ramet .................. H03K 17/145
                                                        327/434

* cited by examiner

Primary Examiner — Jung Kim
(74) Attorney, Agent, or Firm — IPRTOP LLC

(57) ABSTRACT

A differential-follower control circuit has been provided, comprising: a follower; an output-voltage following module, which controls a voltage at a control terminal of the follower to vary with an output voltage; a substrate-voltage following module, which controls a substrate voltage of an output transistor of the follower to vary with an input voltage; an output terminal of the follower is connected to a first terminal of the output-voltage following module; a second terminal of the output-voltage following module is connected to the control terminal of the follower; a first terminal of the substrate-voltage following module is connected to an input terminal of the follower and a second terminal of the substrate-voltage following module is connected to a substrate of the output transistor; the invention effectively improves the overall linearity of the follower.

9 Claims, 3 Drawing Sheets

(58) Field of Classification Search
CPC ............ H03F 2203/5015; H03F 3/505; H03F 1/3217; H03F 2203/5009; H03F 2203/5012; H03F 2203/5018; H03F 2203/5021; H03F 2203/5024; H03F 2203/5031; H03F 2203/5036; H03F 2203/5039

See application file for complete search history.

DIFFERENTIAL-FOLLOWER CONTROL CIRCUIT

FIELD OF TECHNOLOGY

The present disclosure generally relates to the field of integrated circuit design, and in particular to a differential-follower control circuit.

BACKGROUND

In recent years, with the continuous advancement of integrated circuit manufacturing techniques, the characteristic size of MOS transistors has been continuously reduced, and the operating voltage of the corresponding integrated circuit has also been continuously reduced, resulting in a significant reduction in power consumption and further increase in speed of the integrated circuit. However, the output impedance of MOS transistors is also decreasing, and due to the reduction of operating voltage, it has been difficult to use multiple MOS transistors connected in series to achieve a high output impedance, because such structure will consume a large voltage margin.

The above problem poses a challenge for high output impedance applications. Due to the increasing speed of analog-to-digital converters, a follower must be added to the sampling front-end of an analog-to-digital converter, when designing the circuit. The purpose of this follower is to isolate a sampling network inside the chip from the circuit on the board, while driving the sampling network inside the chip. However, when the substrate of a traditional source follower is grounded, a substrate bias effect will occur, and there will be an increased parasitic capacitance when the substrate and the source of the follower are connected, both of which will have a large impact on the linearity of the follower.

SUMMARY

The present disclosure proposes a differential-follower control circuit.

The technical solution used in the present disclosure is as follows.

A differential-follower control circuit, comprising:
a follower;
an output-voltage following module, which controls a voltage at a control terminal of the follower to vary with an output voltage; and
a substrate-voltage following module, which controls a substrate voltage of an output transistor of the follower to vary with an input voltage;
wherein an output terminal of the follower is connected to a first terminal of the output-voltage following module, a second terminal of the output-voltage following module is connected to the control terminal of the follower; a first terminal of the substrate-voltage following module is connected to an input terminal of the follower and a second terminal of the substrate-voltage following module is connected to a substrate of the output transistor.

Optionally, the follower comprises a first MOS transistor, a second MOS transistor, and a first constant current source; wherein the first MOS transistor is the output transistor of the follower, a source of the first MOS transistor outputs the output voltage, the source of the first MOS transistor is also connected to one terminal of the first constant current source, a gate of the first MOS transistor is connected to the input voltage, a drain of the first MOS transistor is connected to a source of the second MOS transistor, a substrate of the first MOS transistor is connected to the substrate-voltage following module; wherein a gate of the second MOS transistor is the control terminal of the follower, and a drain of the second MOS transistor is connected to a supply voltage.

Optionally, the output-voltage following module comprises a second constant current source, and a voltage following unit for detecting and tracking changes in the output voltage of the output transistor, wherein one terminal of the voltage following unit is connected to a source of the output transistor and the other terminal of the voltage following unit is connected to a negative terminal of the second constant current source and the control terminal of the follower, respectively; wherein a positive terminal of the second constant current source is connected to a supply voltage.

Optionally, the voltage following unit comprises at least one resistor and one compensation capacitor, and the resistor and compensation capacitor are connected in parallel.

Optionally, the substrate-voltage following module comprises a third constant current source and a third MOS transistor, wherein a positive terminal of the third constant current source is connected to the supply voltage, and a negative terminal of the third constant current source is connected to a source of the third MOS transistor; wherein a gate of the third MOS transistor is connected to an input of the output transistor, and a drain of the third MOS transistor is grounded; wherein the source of the third MOS transistor is connected to a substrate of the first MOS transistor.

Optionally, the first MOS transistor and the second MOS transistor are NMOS transistors.

Optionally, the third MOS transistor is a PMOS transistor.

Optionally, the circuit further includes a sampling network, wherein the sampling network is connected to an output voltage of the output transistor and uses it as a driving voltage to drive the sampling network for voltage sampling.

Optionally, the sampling network comprises a sampling capacitor, one terminal of the sampling capacitor is connected to a source of the output transistor, and the other terminal of the sampling capacitor is grounded.

As described above, the differential-follower control circuit of the present disclosure has the following beneficial effects:

By controlling the output voltage of the output transistor and the change of the substrate voltage through the output-voltage following module and the substrate-voltage following module respectively, the substrate bias effect can be effectively avoided and the overall linearity of the follower can be enhanced.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout may also be more complicated.

Figure 1:
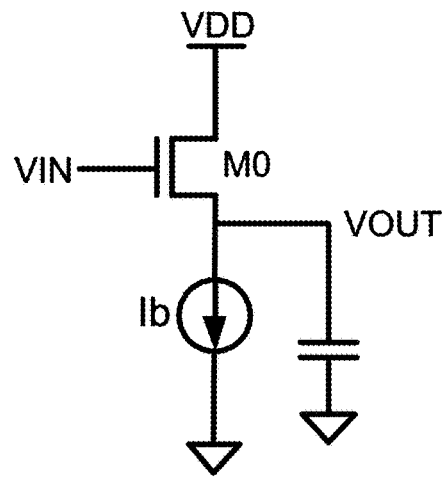
FIG. 1 shows a schematic diagram of a source follower.

Referring to FIG. 1, a traditional source follower includes an NMOS transistor M0 and a constant current source Ib. An input signal VIN is connected to a gate of M0, an output signal VOUT is output through a source of M0, the constant current source Ib is connected to the source of M0, and a drain of M0 is connected to a supply voltage VDD. For a sampling network inside the chip, when the frequency of the input signal is low, the dominant factor for high linearity is a large output impedance provided by the constant current source in the follower, and when the frequency of the input signal is high, the dominant factor for high linearity is a large output current provided by the constant current source in the follower; the two requirements are usually contradictory to each other, because for a constant current source with a MOS transistor, a large output impedance means a small current, and a large current usually leads to a small output impedance. The traditional source follower usually include two NMOS transistors connected in series. One advantage of this structure is that the structure is very simple, and the NMOS transistors as the input transistor can provide a large trans-conductance, and the NMOS transistors as the constant current source can provide a large output impedance, but a disadvantage of this structure is that substrates of the NMOS transistor as the input transistor are grounded, and when the amplitude of the input signal changes greatly, the input transistor will be impacted by a very serious substrate bias effect, changing the threshold voltage of the input transistor, thus affecting the linearity of the whole follower. In order to alleviate the above problem, a substrate bias circuit was introduced into the follower, in which the substrate of a first input transistor is no longer directly grounded, but connected to a source of a second input transistor of another source follower with the same structure, which causes the substrate voltage of the first input transistor to vary with the source voltage of second the input transistor, greatly alleviating the previously described substrate bias effect of the input transistor, and significantly reducing the variation of the threshold voltage of the input transistor; compared with the first traditional structure, the linearity of this structure is significantly improved. However, when acting as a constant current source, NMOS transistors have drain voltages that vary continuously with the input voltage, and currents that vary continuously due to the NMOS transistors' channel length modulation effect, which reduces the output impedance of the NMOS transistors as a constant current source and also affects the linearity of the whole follower.

In order to describe the above problem in more detail, the working principle of the above two types of source followers and their respective advantages and disadvantages are analyzed below.

Figure 2:
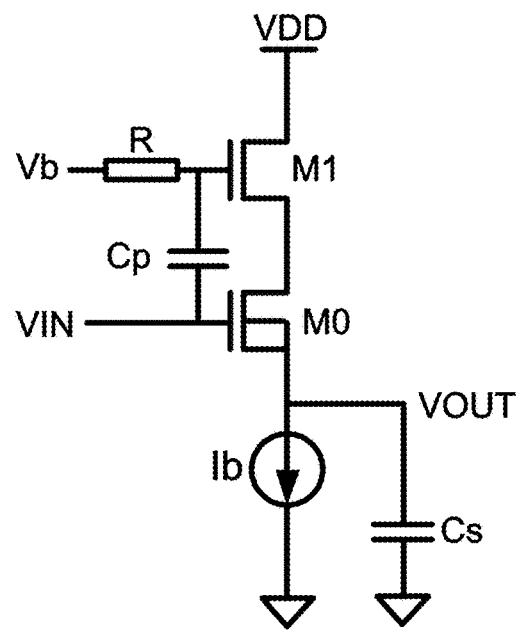
FIG. 2 shows a schematic diagram of a source follower of a traditional structure [1].

The structure [1] is a traditional source follower, as shown in FIG. 2, including NMOS transistors M0, M1, a resistor R, a capacitor Cp, and a constant current source Ib. An input signal VIN is connected to a gate of M0 and one terminal of the capacitor Cp, and a source of M0 is used as a signal output of the source follower, and is connected to one terminal of the constant-current source Ib and the sampling capacitor Cs; the other terminal of the constant-current source Ib is grounded. A drain of M0 is connected to a source of M1, and a substrate of M0 is connected to the source of M0. A gate of M1 is connected to the other terminal of the capacitor Cp and one terminal of the resistor R, and the other terminal of the resistor R is connected to a common mode voltage Vb. When the follower operates normally, a bias voltage Vb is provided to the gate of M1 through the resistor R. When the input signal VIN changes, the change of VIN is coupled to the gate of M1 through an RC network including the resistor R and the capacitor Cp, and then changes in the gate voltage of M1 are transmitted to the source of M1. Thereby, the source voltage of M1 (i.e., drain voltage of M0) is able to vary with VIN, and at the same time, the source voltage of M0 varies with VIN, so that the drain voltage of M0 can vary with the source voltage of M0. Therefore, the drain-source voltage Vds of M0 can be kept constant, which suppresses the variation of the output impedance of the source follower and improves the accuracy of the source follower.

Figure 3:
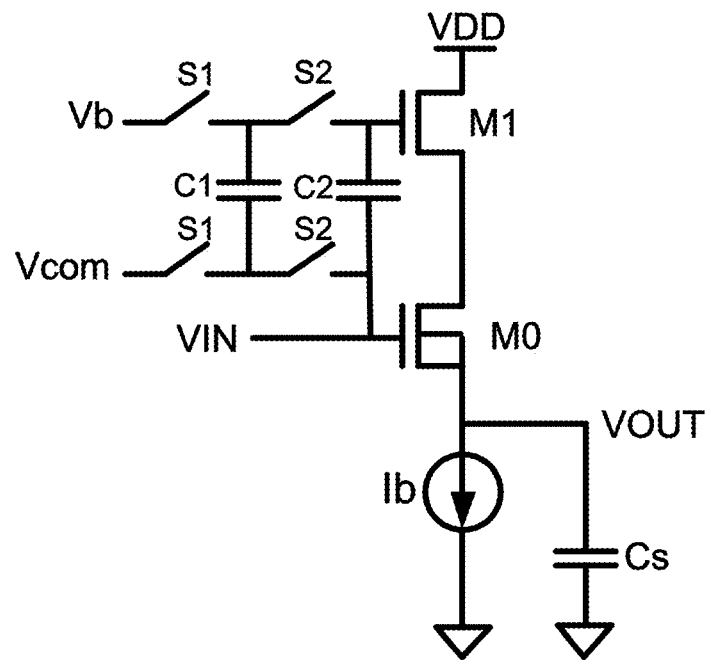
FIG. 3 shows a schematic diagram of a source follower of a traditional structure [2].

The structure [2] is another source follower, as shown in FIG. 3, which includes NMOS transistors M0, M1, capacitors C1 and C2, switches S1 and S2, and a constant current source Ib. An input signal VIN is connected to a gate of M0 and one terminal of the capacitor C2, a source of M0 is a signal output of the source follower, the source of M0 is connected to one terminal of the constant-current source Ib and the sampling capacitor Cs, and the other terminal of the constant-current source Ib is grounded. A drain of M0 is connected to a source of M1, and a substrate of M0 is connected to the source of M0. Vb is a bias voltage, Vcom is a common mode voltage of the input signal, and a gate of M1 is connected to the other terminal of the capacitor C2. The switches S1 and S2 alternately conduct and disconnect to provide bias voltage to the gate of M1, while C2 acts as a coupling capacitor to couple the change of VIN to the gate of M1 and then to the drain of M0, so that the drain-source voltage Vds of M0 can be kept constant, which suppresses the change of the output impedance of the source follower and improves the accuracy of the source follower.

However, structure [1] and structure [2] have the same drawback that the drain voltage of M0 varies with VIN, and there is a mismatch between the change of VIN and the change of M0 source voltage; as a result, the drain-source voltage of M0 has a poor stability, and therefore the output impedance of M0 also has a poor stability. Meanwhile, the substrate and source of M0 are connected to eliminate the substrate-bias effect of M0, but it also increases the parasitic capacitance of the source of M0, which further affects the accuracy of the source follower.

Figure 4:
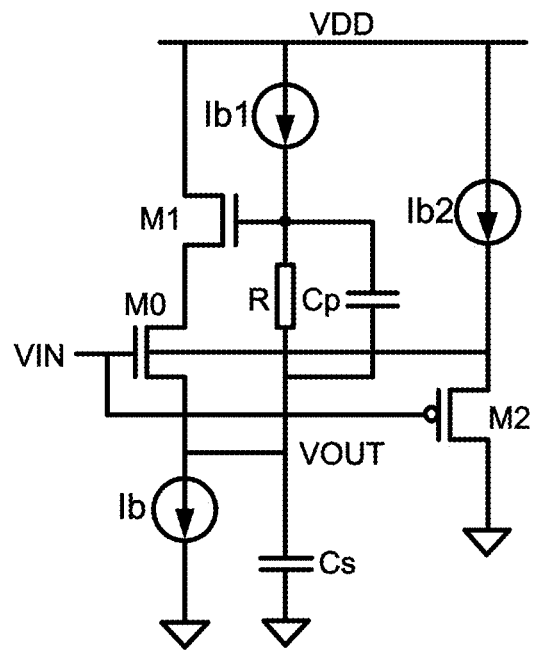
FIG. 4 shows a schematic diagram of a differential-follower control circuit in one embodiment of the present disclosure.

Referring to FIG. 4, the present disclosure provides a differential-follower control circuit, including a follower, an output-voltage following module, and a substrate-voltage following module.

In one embodiment, the follower includes a first MOS transistor M0, a second MOS transistor M1, and a constant current source Ib.

In an embodiment, the output-voltage following module may include a second constant current source Ib1 and a voltage following unit, wherein the voltage following unit may be an RC circuit, and specifically, an RC network consisting of a resistor R and a compensation capacitor Cp connected in parallel.

In one embodiment, the substrate-voltage following module includes a third MOS transistor M2 and a third constant current source Ib2.

In an embodiment, voltage output by the source of the first MOS transistor M0 may be used to drive a sampling network to sample voltage inside the chip. The sampling network may include a sampling capacitor Cs.

In an embodiment, both the first MOS transistor and the second MOS transistor are NMOS transistors, and the third MOS transistor is a PMOS transistor.

Specifically, the input voltage VIN is connected to a gate of M0, a source of M0 is connected to a positive terminal of Ib and one terminal of Cs, respectively, a negative terminal of Ib is grounded, and the other terminal of Cs is grounded; a drain of M0 is connected to a source of M1, and a drain of M1 is connected to a supply voltage VDD.

The parallel-connected resistor R and capacitor Cp has two common terminals, one of which is connected to the source of M0 and the other to a gate of M1 and a negative terminal of Ib1 respectively, and a positive terminal of Ib1 is connected to the supply voltage VDD.

A gate of M2 is connected to the input voltage VIN and the gate of M0, a drain of M2 is grounded, and a source of M2 is connected to the substrate of M0 and a negative terminal of Ib2, respectively.

The RC network consisting of the resistor R and the compensation capacitor Cp makes the gate voltage of M1 vary with the output voltage VOUT of M0. Since the drain of M0 is connected to the source of M1, the drain voltage of M0 varies with the gate voltage of M1. By the above relationship, it can be seen that the drain voltage of M0 can vary with the source voltage of M0. Therefore, it is possible to make the drain-source voltage difference Vds of the M0 transistor not vary with the input signal VIN, thus, making the output impedance of the source of M0 remain constant and improving the accuracy of the source follower of this structure.

In the traditional structures, the substrate and the source of M0 are connected, thus eliminating the voltage difference between the substrate and the source of M0. However, one disadvantage of the traditional structures is that they give the source of M0 a large parasitic capacitance, which also affects the accuracy of the source follower. To solve this problem, the present disclosure introduces a substrate-voltage following module consisting of a PMOS transistor M2 and a constant current source Ib2, as mentioned above. Since the gate of M2 is connected to the input signal VIN and the source of M2 is connected to the substrate of M0, the substrate voltage of M0 is able to vary with the input signal VIN; there is no increase in the parasitic capacitance of the source of M0 while eliminating the substrate bias effect of M0, since the source of M0 is not connected to its substrate.

Thus, suppression of the substrate bias effect of M0 in the source follower is effectively achieved by the present disclosure, and the accuracy of the source follower is improved.

Figure 5:
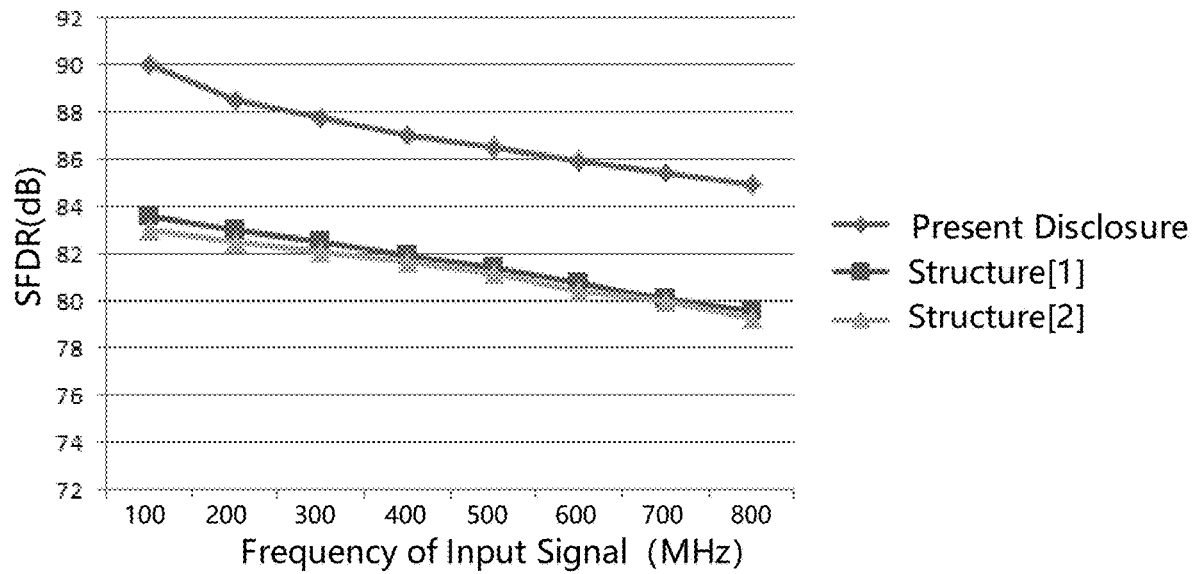
FIG. 5 shows comparison of simulation results of the spurious-free dynamic ranges (SFDR) of three followers with the SFDR varying with the frequency of an input signal.
Figure 6:
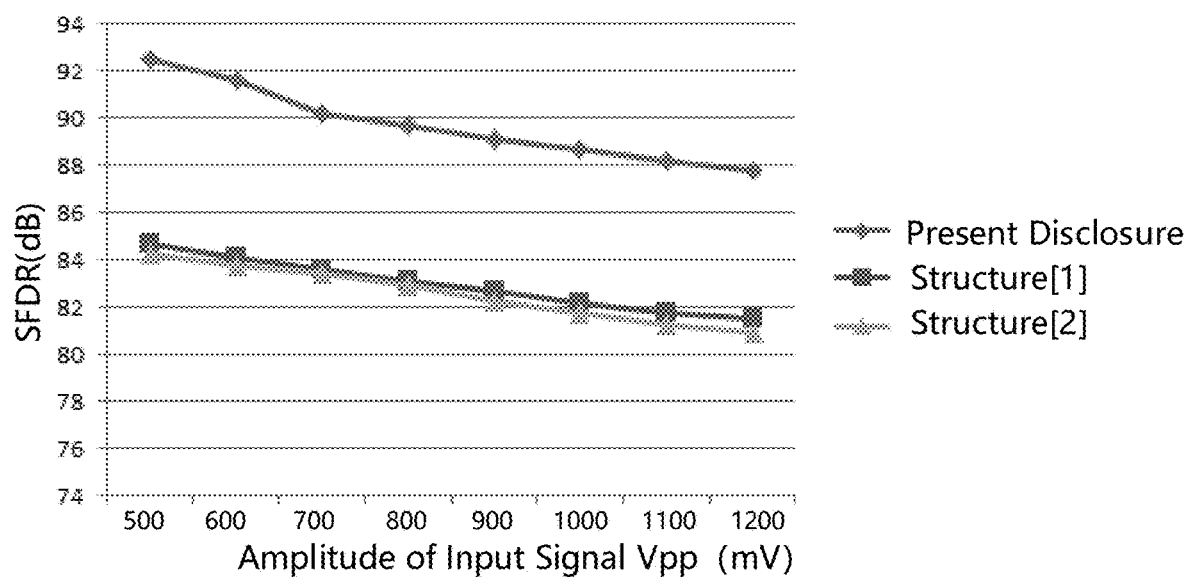
FIG. 6 shows comparison of simulation results of the spurious-free dynamic ranges (SFDR) of three followers with the SFDR varying with the amplitude of an input signal.

In an embodiment, the aforementioned structures are designed under 40 nm CMOS process, and in the three different types of followers as shown in FIGS. 2-4, corresponding parts have the same structures and dimensions, and load transistors in the three different types of followers also have the same structure and dimensions. In the present disclosure, the capacitor Cp of the follower has a capacitance of 0.2 pF, the resistor R has a resistance of 10KΩ, the sampling capacitor Cs has a capacitance of 0.3 pF, the supply voltage VDD is 1.2V, and the input bias voltage VIN is 0.6V. Comparison of simulation results of the spurious-free dynamic ranges (SFDR) of the different types of followers with the SFDR varying with the frequency of an input signal is shown in FIG. 5, where the horizontal coordinate is the frequency of the input signal and the vertical coordinate is the SFDR. From FIG. 5, it can be seen that the present disclosure improves the SFDR by about 6.1 dB when the input frequency is low and by about 5.8 dB when the input frequency is high, compared with the traditional structure [1] and the traditional structure [2]. Comparison of simulation results of the spurious-free dynamic ranges (SFDR) of the different types of followers with the SFDR varying with the amplitude of an input signal is shown in FIG. 6, where the horizontal coordinate is the amplitude of the input signal and the vertical coordinate is the SFDR. From FIG. 6, it can be seen that the present disclosure improves the SFDR by about 8 dB when the amplitude of the input signal is low and by about 6 dB when the amplitude of the input signal is high, compared with the traditional structure [1] and the traditional structure [2].

In summary, in the differential-follower control circuit provided by the present disclosure, the drain voltage of M0 varies with VOUT instead of VIN, unlike the traditional structures, therefore significantly improving the stability of the drain-source voltage difference of M0 and the accuracy of the source follower of this structure; the substrate voltage of M0 can vary with the input signal VIN through M2 and the constant current source Ib2, which stabilizes the substrate-source voltage difference Vbs of M0, eliminating the substrate bias effect of M0 without increasing the parasitic capacitance of the source of M0, which is more advantageous in high-speed applications and improves the accuracy of the source follower; the drain-source voltage difference Vds and the substrate-source voltage difference Vbs of M0 do not vary with the input signal VIN, which obviously improves the accuracy of the source follower, and at the same time, the source follower of the present disclosure does not introduce other non-ideal factors, thus significantly improving the performance of the source follower. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A differential-follower control circuit, comprising:
   a follower;
   an output-voltage following module, which controls a voltage at a control terminal of the follower to vary with an output voltage; and
   a substrate-voltage following module, which controls a substrate voltage of an output transistor of the follower to vary with an input voltage;
   wherein an output terminal of the follower is connected to a first terminal of the output-voltage following module, and a second terminal of the output-voltage following module is connected to the control terminal of the follower; a first terminal of the substrate-voltage following module is connected to an input terminal of the follower and a second terminal of the substrate-voltage following module is connected to a substrate of the output transistor.

2. The differential-follower control circuit according to claim 1, wherein the follower comprises a first MOS transistor, a second MOS transistor, and a first constant current source; wherein the first MOS transistor is the output transistor of the follower, a source of the first MOS transistor outputs the output voltage, the source of the first MOS transistor is also connected to one terminal of the first constant current source, a gate of the first MOS transistor is connected to the input voltage, a drain of the first MOS transistor is connected to a source of the second MOS transistor, and a substrate of the first MOS transistor is connected to the substrate-voltage following module; wherein a gate of the second MOS transistor is the control terminal of the follower, and a drain of the second MOS transistor is connected to a supply voltage.

3. The differential-follower control circuit according to claim 1, wherein the output-voltage following module comprises a second constant current source, and a voltage following unit for detecting and tracking changes in the output voltage of the output transistor, wherein one terminal of the voltage following unit is connected to a source of the output transistor and the other terminal of the voltage following unit is connected to a negative terminal of the second constant current source and the control terminal of the follower, respectively; wherein a positive terminal of the second constant current source is connected to a supply voltage.

4. The differential-follower control circuit according to claim 3, wherein the voltage following unit comprises at least one resistor and one compensation capacitor, and the at least one resistor and the compensation capacitor are connected in parallel.

5. The differential-follower control circuit according to claim 1, wherein the substrate-voltage following module comprises a third constant current source and a third MOS transistor, wherein a positive terminal of the third constant current source is connected to the supply voltage, and a negative terminal of the third constant current source is connected to a source of the third MOS transistor; wherein a gate of the third MOS transistor is connected to an input of the output transistor, and a drain of the third MOS transistor is grounded; wherein the source of the third MOS transistor is connected to a substrate of the first MOS transistor.

6. The differential-follower control circuit according to claim 2, wherein the first MOS transistor and the second MOS transistor are both NMOS transistors.

7. The differential-follower control circuit according to claim 5, wherein the third MOS transistor is a PMOS transistor.

8. The differential-follower control circuit according to claim 1, further comprising a sampling network, wherein the sampling network is connected to an output voltage of the output transistor and uses the output voltage as a driving voltage to drive the sampling network for voltage sampling.

9. The differential-follower control circuit according to claim 8, wherein the sampling network comprises a sampling capacitor, wherein one terminal of the sampling capacitor is connected to a source of the output transistor and the other terminal of the sampling capacitor is grounded.

* * * * *